(12) United States Patent
Guan

(10) Patent No.: US 11,601,122 B2
(45) Date of Patent: Mar. 7, 2023

(54) CIRCUIT FOR SWITCHING POWER SUPPLY AND SWITCHING POWER SUPPLY DEVICE

(71) Applicant: Rohm Co., Ltd., Kyoto (JP)

(72) Inventor: Shidong Guan, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 17/555,865

(22) Filed: Dec. 20, 2021

(65) Prior Publication Data
US 2022/0209764 A1 Jun. 30, 2022

(30) Foreign Application Priority Data
Dec. 28, 2020 (JP) .............................. JP2020-218359

(51) Int. Cl.
| | | |
|---|---|---|
| H03K 3/00 | (2006.01) | |
| H03K 17/687 | (2006.01) | |
| H02H 3/08 | (2006.01) | |
| H02H 7/12 | (2006.01) | |
| H03K 17/082 | (2006.01) | |
| H03K 17/06 | (2006.01) | |
| H02M 3/156 | (2006.01) | |

(52) U.S. Cl.
CPC ........ *H03K 17/0822* (2013.01); *H02M 3/156* (2013.01); *H03K 17/06* (2013.01); *H03K 17/687* (2013.01)

(58) Field of Classification Search
None
See application file for complete search history.

(56) References Cited

U.S. PATENT DOCUMENTS 10,491,099 B2 * 11/2019 Yamaguchi ........... B60R 16/033

FOREIGN PATENT DOCUMENTS

JP          2020078203        5/2020

* cited by examiner

*Primary Examiner* — Kenneth B Wells
(74) *Attorney, Agent, or Firm* — Fish & Richardson P.C.

(57) ABSTRACT

The present disclosure provides a power integrated circuit (IC) for a switching power supply device that generates an output voltage based on an input voltage. The circuit includes: a high-side transistor, disposed between an input terminal applied with the input voltage and a switch terminal; and a low-side transistor, disposed between the switch terminal and a ground terminal. A feedback control for turning on or off the transistor is performed based on a feedback voltage corresponding to the output voltage. A protection circuit is capable of performing a protection operation for turning on the high-side transistor or the low-side transistor regardless of the feedback control based on a switch voltage at the switch terminal and the input voltage, based on a backflow current from the ground terminal to the switch terminal, or based on the input voltage and a predetermined determination voltage.

15 Claims, 10 Drawing Sheets

CIRCUIT FOR SWITCHING POWER SUPPLY AND SWITCHING POWER SUPPLY DEVICE

TECHNICAL FIELD

The present disclosure relates to a circuit and a device for performing power supply switching.

BACKGROUND

A certain type of switching power supply device has a series circuit having a high-side transistor and a low-side transistor, and a direct-current (DC) input voltage is applied to the series circuit. The input voltage is maintained by an input capacitor. Moreover, a voltage having a rectangular waveform obtained by alternately turning on and turning off the high-side transistor and the low-side transistor is rectified and smoothed using a coil and an output capacitor. Accordingly, a DC output voltage stepped down from the input voltage can be obtained.

PRIOR ART DOCUMENT

Patent Publication

[Patent document 1] Japan Patent Publication No. 2020-078203

SUMMARY

Problems to be Solved by the Disclosure

In the switching power supply device above, the input voltage drastically drops to 0 V in case of damage such as short-circuitry of the input capacitor. At this point, there is a concern that accumulated charge of the output capacitor may form a discharging parasitic diode at the high-side transistor that is configured as a metal-oxide-semiconductor field-effect transistor (MOSFET), and this generates more heat. Moreover, when the high-side transistor and the low-side transistor are simultaneously turned off by means of a protective shutdown operation (for example, thermal shutdown) when a large current flows through a coil, there is a concern that the large current may flow to a parasitic diode of the low-side transistor, and this similarly produces more heat.

It is an object of the disclosure to provide a circuit for switching power supply and a switching power supply device inhibiting excess heat generation.

Technical Means for Solving the Problem

A circuit for switching power supply is configured as below (first configuration), that is, for forming a switching power supply device that generates an output voltage based on an input voltage, and including: an input terminal, which should receive the input voltage; a switch terminal; a ground terminal; a high-side transistor, disposed between the input terminal and the switch terminal; a low-side transistor, disposed between the switch terminal and the ground terminal; a gate driver, configured for driving each gate of the high-side transistor and the low-side transistor; a control circuit, using the gate driver to perform a feedback control to turn on or off the high-side transistor and the low-side transistor based on a feedback voltage corresponding to the output voltage; and a protection circuit, capable of performing a protection operation for turning on the high-side transistor or the low-side transistor regardless of the feedback control based on a switch voltage at the switch terminal and the input voltage, based on a backflow current from the ground terminal to the switch terminal, or based on the input voltage and a predetermined determination voltage.

The circuit for switching power supply of the first configuration may also be configured as below (second configuration), wherein the protection circuit performs the protection operation when the switch voltage is greater than the input voltage.

The circuit for switching power supply of the second configuration may also be configured as below (third configuration), wherein the protection circuit includes a comparator that compares the switch voltage with the input voltage, and when a signal indicating the switch voltage is greater than the input voltage output from the comparator, the protection operation is performed.

The circuit for switching power supply of the second configuration may also be configured as below (fourth configuration), further including a boot terminal connected to the switch terminal via a capacitor, wherein the high-side transistor and the low-side transistor are alternately turned on and off by the feedback control to generate a boot voltage greater than the input voltage at the boot terminal, the protection circuit includes a protection transistor that is turned on according to a difference between the switch voltage and the input voltage when the switch voltage is greater than the input voltage, the protection operation is performed during an on period of the protection transistor, and the high-side transistor is turned on based on the boot voltage in the protection operation.

The circuit for switching power supply of the second configuration may also be configured as below (fifth configuration), wherein the protection circuit includes a protective transistor that is turned on according to a difference between the switch voltage and the input voltage when the switch voltage is greater than the input voltage, the protection operation is performed during an on period of the protective transistor, and the low-side transistor is turned on based on the switch voltage in the protection operation.

The circuit for switching power supply of the first configuration may also be configured as below (sixth configuration), wherein the protective circuit detects the backflow current in a shutdown state in which the feedback control is stopped, and performs the protection operation of turning on the low-side transistor based on a detection result of the backflow current.

The circuit for switching power supply of the first configuration may also be configured as below (seventh configuration), further including an undervoltage-lockout (UVLO) detection circuit that outputs a predetermined UVLO signal when the input voltage drops below the predetermined determination voltage, and the protective circuit receives an output of the UVLO signal and performs the protection operation.

A switching power supply device of the disclosure is configured as below (eighth configuration) including: the circuit for switching power supply of any one of the first to seventh configuration; a rectifying smoothing circuit, generating the output voltage by means of rectifying and smoothing the switch voltage generated at the switch terminal by alternately turning on and off the high-side transistor and the low-side transistor by the feedback control; and a feedback circuit, generating the feedback voltage corresponding to the output voltage.

Effects of the Disclosure

According to the disclosure, a circuit for switching power supply and a switching power supply device inhibiting excess heat generation are provided.

DETAILED DESCRIPTION OF THE EMBODIMENTS

Figure 1:
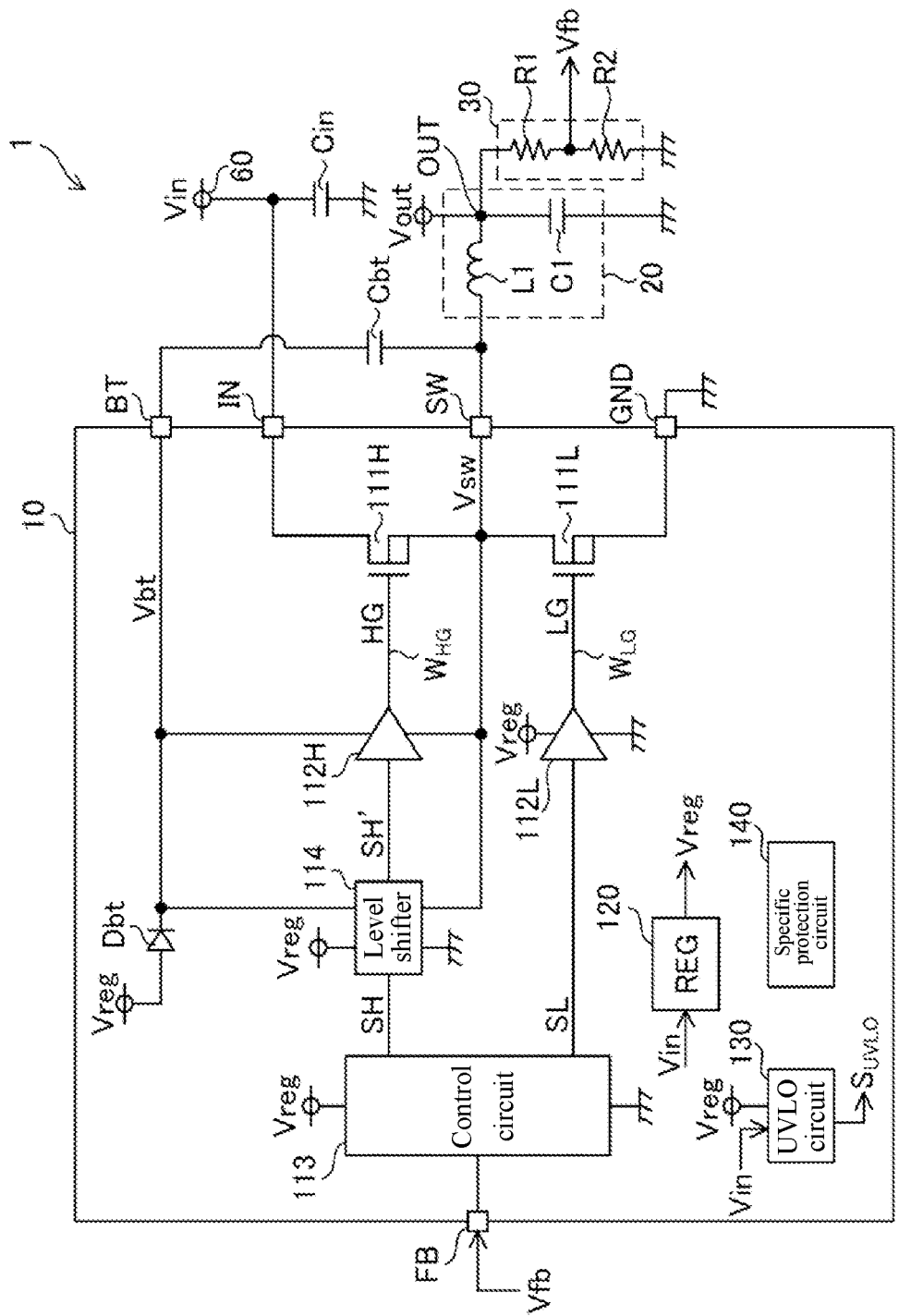
FIG. 1 is an overall configuration diagram of a switching power supply device 1 according to an embodiment of the disclosure.

Details of the embodiments of the present disclosure are specifically described with the accompanying drawings below. In the reference drawings, the same parts are denoted by the same numerals or symbols, and repeated description related to the same parts are in principle omitted. Further, to keep the description of the application simple, the names of corresponding information, signals, physical quantities, elements or parts corresponding to the numerals or symbols are sometimes omitted or expressed in short by adding identifying information of numerals or symbols of reference information, signals, physical quantities, elements or parts. For example, a high-side transistor (referring to FIG. 1) referenced by "111H" described below is sometimes expressed as a high-side transistor 111H, or is sometimes expressed in short as a transistor 111H, with both these cases referring to the same part.

Some terms used in the description of the embodiments of the disclosure are first explained below. The term IC refers to an integrated circuit. The so-called "ground" refers to a reference conductive portion acting as a reference voltage of 0 V potential or the 0 V potential itself. The reference conductive portion is a conductor formed of such as metal. The 0 V potential and 0 V voltage are sometimes referred to as a ground potential and a ground voltage. In the embodiments of the disclosure, a voltage expressed without a specifically configured reference represents a potential from a ground aspect. For any concerned signal or voltage, the level refers to the level of a potential, and a high level has a potential higher than that of a low level. For any concerned signal or voltage, the signal or voltage at a high level strictly means that the level of the signal or voltage is at a high level, and the signal or voltage at a low level strictly means that the level of the signal or voltage is at a low level. The level regarding a signal is sometimes expressed as a signal level, and the level regarding a voltage is sometimes expressed as a voltage level.

For any transistor configured as a field-effect transistor (FET) including a metal-oxide-semiconductor field-effect transistor (MOSFET), an on state refers to a state of conduction between the drain and the source of the transistor, and an off state refers to a state of non-conduction (a state of disconnection) between the drain and the source of the transistor. The same applies to non-FET transistors. Unless otherwise specified, a MOSFET is interpreted as an enhanced MOSFET. MOSFET is an abbreviation of metal-oxide-semiconductor field-effect transistor.

Electrical characteristics of a MOSFET include a gate threshold voltage. For any transistor serving as an N-channel and reinforced MOSFET, the gate potential of the transistor is higher than the source potential of the transistor, and when the value of the gate-source voltage (the gate potential observed from the source potential) of the transistor is above the gate threshold voltage of the transistor, the transistor becomes in an on state, otherwise the transistor becomes in an off state. For any transistor serving as a P-channel and reinforced MOSFET, the gate potential of the transistor is lower than the source potential of the transistor, and when the value of the gate-source voltage (the gate potential observed from the source potential) of the transistor is below the gate threshold voltage of the transistor, the transistor becomes in an on state, otherwise the transistor becomes in an off state.

More than one field-effect transistor (FET) may be configured as any switch, two terminals of the switch are conducted when the switch is in an on state, and on the other hand, the two terminals of the switch are non-conducted when the switch is in an off state. In the description below, for any transistor or switch, the on state and the off state may also be expressed simply as on and off. Moreover, for any transistor or switch, a period in which the transistor or the switch becomes in an on state is referred to an on period, and a period in which the transistor or the switch is changed to being in an off state is referred to as an off period.

For any signal of which the signal level adopts a high level or a low level, a period in which the level of the signal is changed to a high level is referred to as a high-level period, and a period in which the level of the signal is changed to a low level is referred to as a low-level period. The same applies to any voltage of which the voltage level adopts a high level or a low level. A connection formed between multiple parts of a circuit, such as elements, wires and nodes that form a circuit, refers to an electrical connection unless otherwise specified.

FIG. 1 shows an overall configuration diagram of a switching power supply device 1 according to an embodiment of the disclosure. The switching power supply device 1 is a step-down direct-current/direct-current (DC/DC) converter that generates a DC output voltage Vout from a DC input voltage Vin. The switching power supply device 1 includes a power integrated circuit (IC) 10 forming an example of a circuit for switching power supply of the switching power supply device 1, a rectifying smoothing circuit 20, a feedback circuit 30, a bootstrap capacitor Cbt and an input capacitor Cin. The rectifying smoothing circuit 20, the feedback circuit 30, the bootstrap capacitor Cbt and the input capacitor Cin are disposed outside the power IC 10. Moreover, it may also be considered to exclude the input capacitor Cin from constituent elements of the switching power supply device 1. The rectifying smoothing circuit 20 has a coil L1 and a capacitor (output capacitor C1). The feedback circuit 30 has resistors R1 and R2.

Figure 2:
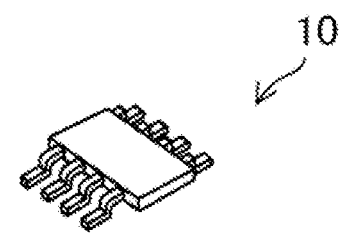
FIG. 2 is a three-dimensional appearance diagram of an integrated circuit (IC) according to an embodiment of the present disclosure.

FIG. 2 shows an example of an appearance of the power IC 10. The power IC 10 is an electronic component (semiconductor device) formed by packaging a semiconductor IC in a housing (package) formed by a resin. Each circuit forming the power IC 10 is integrated in the semiconductor. A plurality of external terminals exposed from the housing to the outside of the power IC 10 are provided at the housing of the electronic component serving as the power IC 10. In addition, the number of external terminals and the type of housing shown in FIG. 2 are merely some examples, and various modifications may be made thereto. In FIG. 1, only a boot terminal BT, an input terminal IN, a switch terminal SW, a ground terminal GND and a feedback terminal FB are depicted as a part of the plurality of external terminals of the power IC 10. External terminals other than those above are also arranged in the power IC 10.

The input terminal IN connected to an application terminal 60 (a terminal applied with the input voltage Vin) of the input voltage Vin on the outside of the power IC 10. Thus, the input voltage Vin is applied to the input terminal IN. On the outside of the power IC 10, the input capacitor Cin is placed between the application terminal 60 of the input voltage Vin and the ground. The input voltage Vin is in principle a positive DC voltage. However, as described below, the input voltage Vin may be 0 V in special circumstances. A situation where the input voltage Vin is 0 V is to be described shortly. Herein, it is first considered that the input voltage Vin is made to have a predetermined positive standard input voltage value (for example, 12 V), and the configuration and operation of the switching power supply device 1 are described.

The power IC 10 has a high-side transistor 111H, a low-side transistor 111L, a high-side driver 112H, a low-side driver 112L, a control circuit 113, a level shifter 114, an internal power circuit 120, a UVLO circuit 130, a specific protection circuit 140 and a bootstrap diode Dbt. The transistors 111H and 111L are configured as N-channel metal-oxide semiconductor field-effect transistors (MOSFETs). Using the high-side driver 112H and the low-side driver 112L, gate drivers driving the gates of the transistors 111H and 111L are formed. It may also be interpreted as that the level shifter 114 is included in the constituent elements of the gate driver.

The drain of the transistor 111H is connected to the input terminal IN. The source of the transistor 111H and the drain of the transistor 111L are commonly connected by the switch terminal SW. The source of the transistor 111L is connected to the ground terminal GND. The ground terminal GND is grounded.

One end of the capacitor Cbt is connected to the switch terminal SW, and the other end of the capacitor Cbt is connected to the boot terminal BT. The anode of the diode Dbt is connected to an application terminal of an internal power voltage Vreg (that is, a terminal applied with the internal power voltage Vreg), and the cathode of the diode Dbt is connected to the boot terminal BT. One terminal of the coil L1 is connected to the switch terminal SW, and the other terminal of the coil L1 is connected to an output node OUT. The capacitor C1 is disposed between the output node OUT and the ground. The output node OUT generates the output voltage Vout. The output node OUT is further connected to the feedback circuit 30. The feedback circuit 30 generates and outputs the feedback voltage Vfb corresponding to the output voltage Vout. In the configuration example in FIG. 1, the feedback circuit 30 is formed by a series circuit of the resistors R1 and R2. One end portion of the resistor R1 is connected to the output node OUT, and the other end portion of the resistor R1 is grounded via the resistor R2. A connection node between the resistors R1 and R2 generates a divided voltage of the output voltage Vout as the feedback voltage Vfb. The feedback voltage Vfb is input to the feedback terminal FB.

The control circuit 113 generates and outputs a high-side control signal SH for the high-side driver 112H and a low-side control signal SL for the low-side driver 112L based on the voltage at the feedback terminal FB, that is, the feedback voltage Vfb. The control signals SH and SL are binary signals each adopting a high level or a low level. The control circuit 113 uses the internal power voltage Vreg as a power voltage at the high potential side and uses the ground voltage as the power voltage at the low potential side to generate the control signals SH and SL. Thus, for the control signals SH and SL, the high level is equivalent to the potential level of the internal power voltage Vreg, and the low level is equivalent to the potential level of the ground. The level shifter 114 is connected to the terminal applied with the interval power voltage Vreg and the ground, and is connected to the terminals BT and SW. The level shifter 114 shifts the level of the control signal SH to generate a shifted high-side control signal SH' based on the internal power voltage Vreg supplied and a voltage between the terminals BT and SW. The high-side control signal SH' is also a binary signal adopting a high level or a low level similarly to the high-side control signal SH. However, the high level of the high-side control signal SH' is equivalent to the potential level of the boot terminal BT, and the low level of the high-side control signal SH' is equivalent to the potential level of the switch terminal SW. When the control signal SH is at a high level and a low level, the control signal SH' also respectively becomes at a high level and a low level. In the description below, the voltage applied to the boot terminal BT is sometimes referred to as a boot voltage Vbt, and the voltage applied to the switch terminal SW is sometimes referred to as a switch voltage Vsw.

The high-side driver 112H is connected to the gate of the transistor 111H by a wire $W_{HG}$, and drives the gate of the transistor 111H based on the high-side control signal SH'. One terminal of the wire $W_{HG}$ is connected to an output terminal of the driver 112H, and the other terminal of the wire $W_{HG}$ is connected to the gate of the transistor 111H. The voltage at the gate of the transistor 111H is referred to as a gate voltage HG. Specifically, the high-side driver 112H operates by using the boot voltage Vbt as the power supply voltage at the high-potential side and uses the switch voltage Vsw as the power supply voltage at the low-potential side, and supplies the gate voltage GH corresponding to the high-side control signal SH' to the gate of the transistor 111H, accordingly controlling the state of the transistor 111H. When the level of the high-side control signal SH' is at a high level and a low level, the high-side driver 112H sets the level of the gate voltage HG to a high level and a low level, respectively. The high level of the gate voltage HG is equivalent to the level of the boot voltage Vbt, and the low level of the gate voltage HG is equivalent to the level of the switch voltage Vsw. The transistor 111H is in an on state when the gate voltage HG is at a high level, and is in an off state when the gate voltage HG is at a low level.

The low-side driver 112L is connected to the gate of the transistor 111L by a wire $W_{LG}$, and drives the gate of the transistor 111L based on the low-side control signal SL. One terminal of the wire $W_{LG}$ is connected to an output terminal of the driver 112L, and the other terminal of the wire $W_{LG}$ is connected to the gate of the transistor 111L. The voltage at the gate of the transistor 111L is referred to as a gate voltage LG. Specifically, the low-side driver 112L operates by using the internal power voltage Vreg as the power voltage at the high-potential side and uses the ground as the power supply voltage at the low-potential side, and supplies the gate voltage LG corresponding to the low-side control signal SL to the gate of the transistor 111L, accordingly controlling the state of the transistor 111L. When the level of the low-side control signal SL is at a high level and a low level, the low-side driver 112L sets the level of the gate voltage LG to a high level and a low level, respectively. The high level of the gate voltage LG is equivalent to the potential level of the internal power voltage Vreg, and the low level of the gate voltage LG is equivalent to the potential level of the ground. The transistor 111L is in an on state when the gate voltage LG is at a high level, and is in an off state when the gate voltage LG is at a low level.

The internal power circuit 120 generates the internal power voltage Vreg based on the input voltage Vin applied to the input terminal IN. When the input voltage Vin is above a fixed voltage (for example, a determination voltage $V_{UVLO1}$ below), the internal power voltage Vreg has a predetermined positive DC voltage value (for example, 5.0 V). The internal power circuit 120 may also generate a plurality of internal power voltages Vreg having different voltage values from one another. The description below focuses on only one internal power voltage Vreg.

In the power device 1 and the power IC 10, a target voltage Vtg is set for the output voltage Vout. The target voltage Vtg has a predetermined positive DC voltage value (for example, 5 V). The input voltage Vin is in principle greater than the target voltage Vtg. To keep the description simple, a state in which the input voltage Vin has a voltage value (for example, a standard input voltage value described above) greater than that of the target voltage Vtg (for example, 5 V) is referred to as a normal input state.

In the normal input state, the control circuit 113 performs a feedback control. In the feedback control, the control circuit 113 controls the on/off states of the transistors 111H and 111L by generating and outputting the control signals SH and SL based on the feedback voltage Vfb, so as to stabilize the output voltage Vout at the target voltage Vtg (thereby reducing a difference between the output voltage Vout and the target voltage Vtg). In the feedback control, a high output state in which the transistor 111H is turned on and the transistor 111L is turned off and a low output state in which the transistor 111H is turned off and the transistor 111L is turned on are alternated, and at this point, a ratio of a period length of the high output state to a period length of the low output state is adjusted based on the feedback voltage Vfb. The object of such adjustment is to have the output voltage Vout coincide with the target voltage Vtg (thereby reducing the difference between the output voltage Vout and the target voltage Vtg). The control circuit 113 is capable of performing the adjustment by means of pulse width modulation or pulse frequency modulation based on the feedback voltage Vfb.

In the normal input state, a current in the high output state flows from the input terminal IN through the transistor 111H to the coil L1 and energy is thus accumulated in the coil L1; in the following low output state, the current based on the accumulated energy in the coil L1 flows from the transistor 111L to the coil L1. By repeatedly alternating the high output state and the low output state, the switch terminal SW generates a rectangular wave switching voltage whose potential level changes between the potential level of the input voltage Vin and the potential level of the ground. The DC output voltage Vout is obtained by means of rectifying and smoothing the switching voltage generated by the switch terminal SW by the rectifying and smoothing circuit 20. Further, in order to prevent a through current from being generated between the transistors 111H and 111L, a dead time period in which both the transistors 111H and 111L are off may be placed between a period of the high output state and a period of the low output state.

In the power device 1, the capacitor Cbt and the diode Dbt form a bootstrap circuit, and gate driving of the transistor 111H is implemented by the bootstrap circuit. That is, during the process of repeatedly alternating the high output state and the low output state, in the low output state in which the transistor 111L is turned on (that is, when the voltage at the switch terminal SW is substantially 0 V), the boot terminal BT is considered be at the high side, and the capacitor Cbt is charged via the diode Dbt by the internal power voltage Vreg. Then, once switching is made to the high output state, when the inter-terminal voltage of the capacitor Cbt is kept as the internal power voltage Vreg, the voltage of the switch terminal SW substantially rises to the input voltage Vin, and thus the boot voltage Vbt substantially becomes a voltage (Vreg+Vrin) (to keep the description simple, a forward voltage of the diode Dbt is neglected). That is, during the period of repeatedly alternating the high output state and the low output state, the voltage between the terminals BT and SW (Vbt−Vsw) is persistently substantially the same as the internal power voltage Vreg, and thus the transistor 111H may be turned on and turned off by the driver 112H.

Figure 3:
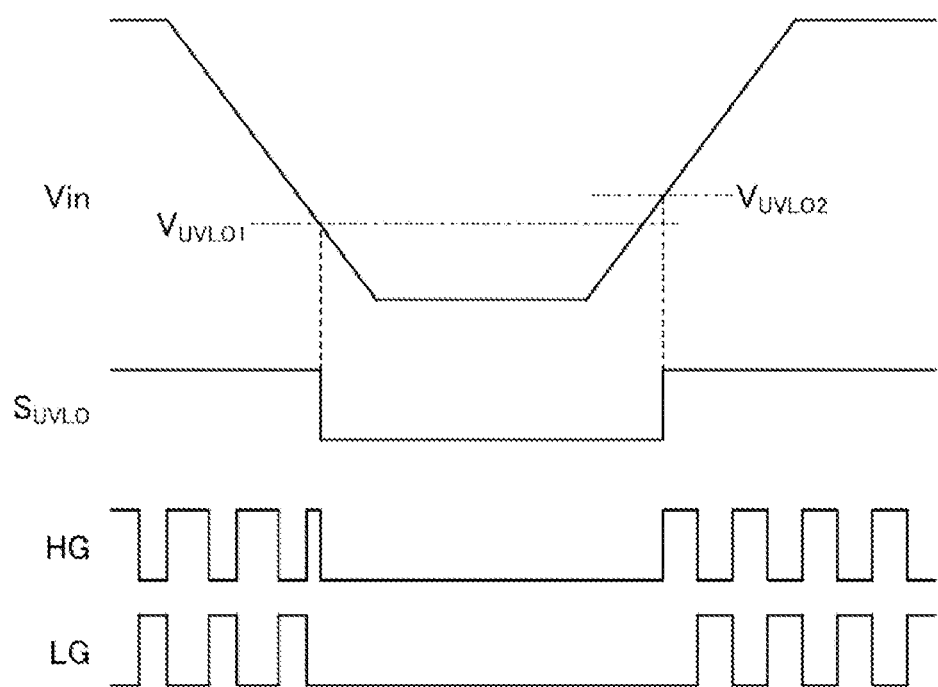
FIG. 3 is a diagram illustrating a relation between an input voltage and other signals according to an embodiment of the disclosure.

The UVLO circuit 130 detects an overly low state, that is, the UVLO state, of the input voltage Vin, and outputs a signal $S_{UVLO}$ indicating a detection result. The UVLO circuit 130 operates based on the internal power voltage Vreg. The operation of the UVLO circuit 130 is to be described with reference to FIG. 3 below. In the UVLO circuit 130, the predetermined determination voltages $V_{UVLO1}$ and $V_{UVLO2}$ generated based on the internal power voltage Vref are individually compared with the input voltage Vin. The determination voltage $V_{UVLO2}$ is greater than the determination voltage $V_{UVLO1}$ by only a predetermined hysteresis voltage (for example, 0.1 V). The standard input voltage value is greater than the value of the determination voltage $V_{UVLO2}$. It is considered that the input voltage Vin is reduced from a starting point that is a state in which the input voltage Vin is sufficiently high and the feedback control is being performed. The UVLO circuit 130 causes the signal $S_{UVLO}$ to be in a high level in the state of the starting point. When the input voltage Vin is below the determination voltage $V_{UVLO1}$ by reducing the input voltage Vin, the UVLO circuit 130 switches the signal $S_{UVLO}$ from a high level to a low level. Then, the signal $S_{UVLO}$ is kept at a low level until the input voltage Vin is above the determination voltage $V_{UVLO2}$, and then the UVLO circuit 130 switches the signal $S_{UVLO}$ from a low level to a high level when the input voltage Vin is above the determination voltage $V_{UVLO2}$. The signal $S_{UVLO}$ at a low level is a valid signal (ULVO signal) indicating a UVLO state. The signal $S_{UVLO}$ at a high level is an invalid signal indicating a non-UVLO state.

The power IC 10 is in an off state during a low level period of the signal $S_{UVLO}$. The feedback control stops when the power IC 10 is in an off state. When the signal $S_{UVLO}$ is switched from a high level to a low level, positive charge is seized from the gates of the transistors 111H and 111L by the drivers 112H and 112L under the control of the control circuit 113, and accordingly, the gate voltages HG and LG become at a low level. Then, during a period in which the feedback control is stopped, both the transistors 111H and 111L are fixed at an off state. However, according to the function of the specific protection circuit 140, during the period in which the feedback control is stopped (hence being in a shutdown state), the transistor 111H or 111L is sometimes temporarily turned on (with details to be described below). An erroneous operation generated due to an overly low input voltage Vin can be inhibited using the ULVO circuit 130.

Figure 4:
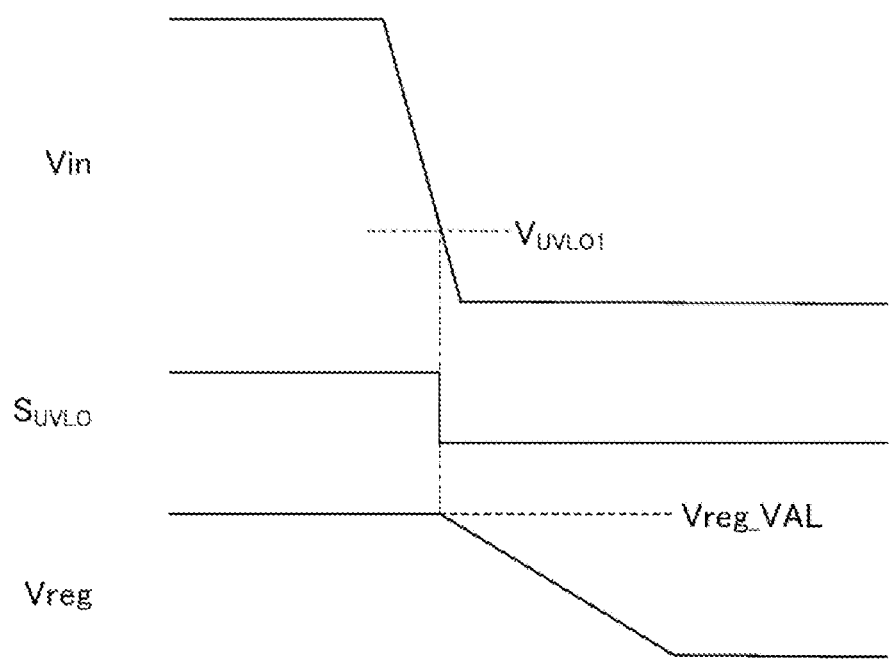
FIG. 4 is a diagram illustrating a change in an internal power supply voltage when an input voltage drops according to an embodiment of the disclosure.

FIG. 4 shows a relation of the signal $S_{UVLO}$ and the internal power voltage Vreg. Because the input voltage Vin is sufficiently high (that is, above the determination voltages $V_{UVLO1}$ and $V_{UVLO2}$), when the signal $S_{UVLO}$ is at a high level, the internal power circuit 120 generates and stabilizes the internal power voltage Vreg by way of having the internal power voltage Vreg have a predetermined and fixed positive voltage value Vreg_VAL (for example, 5.0 V). When the signal $S_{UVLO}$ switches from a high level to a low level, the generating of the internal power voltage Vreg of the internal power circuit 120 stops. However, an output capacitor (not shown) applied with the internal power voltage Vreg is provided in the internal power circuit 120, and so even if the generating of the internal power voltage Vreg stops, the internal power voltage Vreg does not immediately become 0 V. That is, triggered by switching of the signal $S_{UVLO}$ from a high level to a low level, when the generating of the internal power supply voltage Vreg stops, the value of the internal power supply voltage Vreg gradually drops from the voltage value Vreg_VAL to 0 V, starting from instant of the switching.

When the value of the input voltage Vin gradually drops from the standard input voltage value (for example, 12 V) to 0 V, no particular issues are incurred. However, a case in which ground short-circuitry at the application terminal 60 of the input voltage Vin takes place when positive charge is accumulated in the capacitor C1 (that is, when "Vout>0") (to be referred to as a first case) is taken into account. For example, a case in which damage such as short-circuitry in the input capacitor Cin applied with the input voltage Vin takes place is equivalent to the first case. In the first case, a large current instantaneously flows through the parasitic diode of the high-side transistor 111H (with however it is assumed that the specific protection circuit 140 is absent). The parasitic diode of the transistor 111H is a diode added to the transistor 111H when a MOSFET is used to form the transistor 111H, and has a positive direction in a direction from the source to the drain of the transistor 111H. When a large current flows to the parasitic diode of the high-side transistor 111H, the parasitic diode produces more heat and this undesirably affects the power IC 10.

Moreover, a case in which both the transistors 111H and 111L are turned off by a protective shutdown operation when a large current flows from the switch terminal SW to the output node OUT (to be referred to as a second case) is also considered. In the second case, a large current flows into the parasitic diode of the low-side transistor 111L (with however it is assumed that the specific protection circuit 140 is absent). The parasitic diode of the transistor 111L is a diode added to the transistor 111L when a MOSFET is used to form the transistor 111L, and has a positive direction in a direction from the source to the drain of the transistor 111H. When a large current flows to the parasitic diode of the low-side transistor 111L, the parasitic diode produces more heat and this undesirably affects the power IC 10. Further, the so-called protective shutdown operation refers to an operation for shutting down the power IC 10 in order to protect the power IC 10. For example, a TSD circuit (not shown) for detecting whether the temperature in the power IC 10 is above a predetermined shutdown temperature is arranged at the power IC 10, and the protective shutdown operation is performed when it is detected by the TSD circuit that the temperature in the power IC 10 is above the shutdown temperature. Moreover, an operation of outputting the signal $S_{UVLO}$ at a low level to shut down the power IC 10 is also a type of the protective shutdown operation.

The specific protection circuit 140 performs the protection operation, that is, inhibiting the heat generated in the power IC 10 to a lower extent in the first case or the second case, thereby suppressing undesirable effects on the power IC 10. In the description below, a protection operation performed by the specific protection circuit 140 is referred to as a specific protection operation. In the specific protection operation, the specific protection circuit 140 turns on the high-side transistor 111H or the low-side transistor 111L regardless of the feedback control (in other words, irrelevant to the feedback voltage Vfb).

The specific protection operation for turning on the high-side transistor 111H may also be a specific protection operation $H_{ON\_FL}$ for fully turning on the transistor 111H. The so-called fully turning on the transistor 111H refers to an operation that continuously keeps the transistor 111H in an on state. The specific protection operation $H_{ON\_FL}$ may be performed for a predetermined period, or may be performed until the on state of the transistor 111H is no longer maintained due to decreasing of the power voltage required for turning on the transistor 111H.

The specific protection operation for turning on the high-side transistor 111H may also be a specific protection operation $H_{ON\_PLS}$ for turning on the pulse of the transistor 111H. The so-called turning on the pulse of the transistor 111H refers to an operation that periodically and alternately turns on and off the transistor 111H. At this point, the duty cycle of the transistor 111H may be an arbitrary and predetermined value. The specific protection operation $H_{ON\_PLS}$ may be performed for a predetermined period, or may be performed until the pulse of the transistor 111H can no longer be turned on due to decreasing of the power voltage required for turning on the transistor 111H.

The specific protection operation for turning on the low-side transistor 111L may also be a specific protection operation $L_{ON\_FL}$ for fully turning on the transistor 111L. The so-called fully turning on the transistor 111L refers to an operation that continuously keeps the transistor 111L in an on state. The specific protection operation $L_{ON\_FL}$ may be performed for a predetermined period, or may be performed until the on state of the transistor 111L is no longer maintained due to decreasing of the power voltage required for turning on the transistor 111L.

The specific protection operation for turning on the low-side transistor 111L may also be a specific protection operation $L_{ON\_PLS}$ for turning on the pulse of the transistor 111L. The so-called turning on the pulse of the transistor 111L refers to an operation that periodically and alternately turns on and turns off the transistor 111H. At this point, the duty cycle of the transistor 111L may be an arbitrary and predetermined value. The specific protection operation $L_{ON\_PLS}$ may be performed for a predetermined period, or may be performed until the pulse of the transistor 111L can no longer be turned on due to decreasing of the power voltage required for turning on the transistor 111L.

In the first case, by performing the specific protection operation $H_{ON\_FL}$ or $L_{ON\_PLS}$, the amount of heat generated in the power IC 10 by the current flowing from the switch terminal SW to the input terminal IN is reduced (reduced compared to the amount of heat generated in the power IC 10 when only the current flows in the parasitic diode of the transistor 111H), and thus concerns for heat generation can be eliminated or mitigated. The reason for the above is that, it is predicted that a voltage drop caused by a product of the current flowing from the switch terminal SW to the input terminal IN and the on resistance of the transistor 111H is lower than a positive voltage of the parasitic diode of the transistor 111L. In the first case, the specific protection operation $L_{ON\_FL}$ or $L_{ON\_PLS}$ is also performed to eliminate or mitigate concerns for heat generation. When the specific protection operation $L_{ON\_FL}$ or $L_{ON\_PLS}$ is performed in the first case, a current flows through a pathway from the switch terminal SW via the low-side transistor 111L, and the amount of heat generated is lower compared to that when a current flows to the parasitic diode of the transistor 111L.

By performing the specific protection operation $L_{ON\_FL}$ or $L_{ON\_PLS}$ in the second case, concerns for heat generation are eliminated or mitigated. When the specific protection operation $L_{ON\_FL}$ or $L_{ON\_PLS}$ is performed in the second case, a current flows through a pathway from the ground via the low-side transistor 111L, and the amount of heat generated is lower compared to that when a current flows to the parasitic diode of the transistor 111L.

Figure 5:
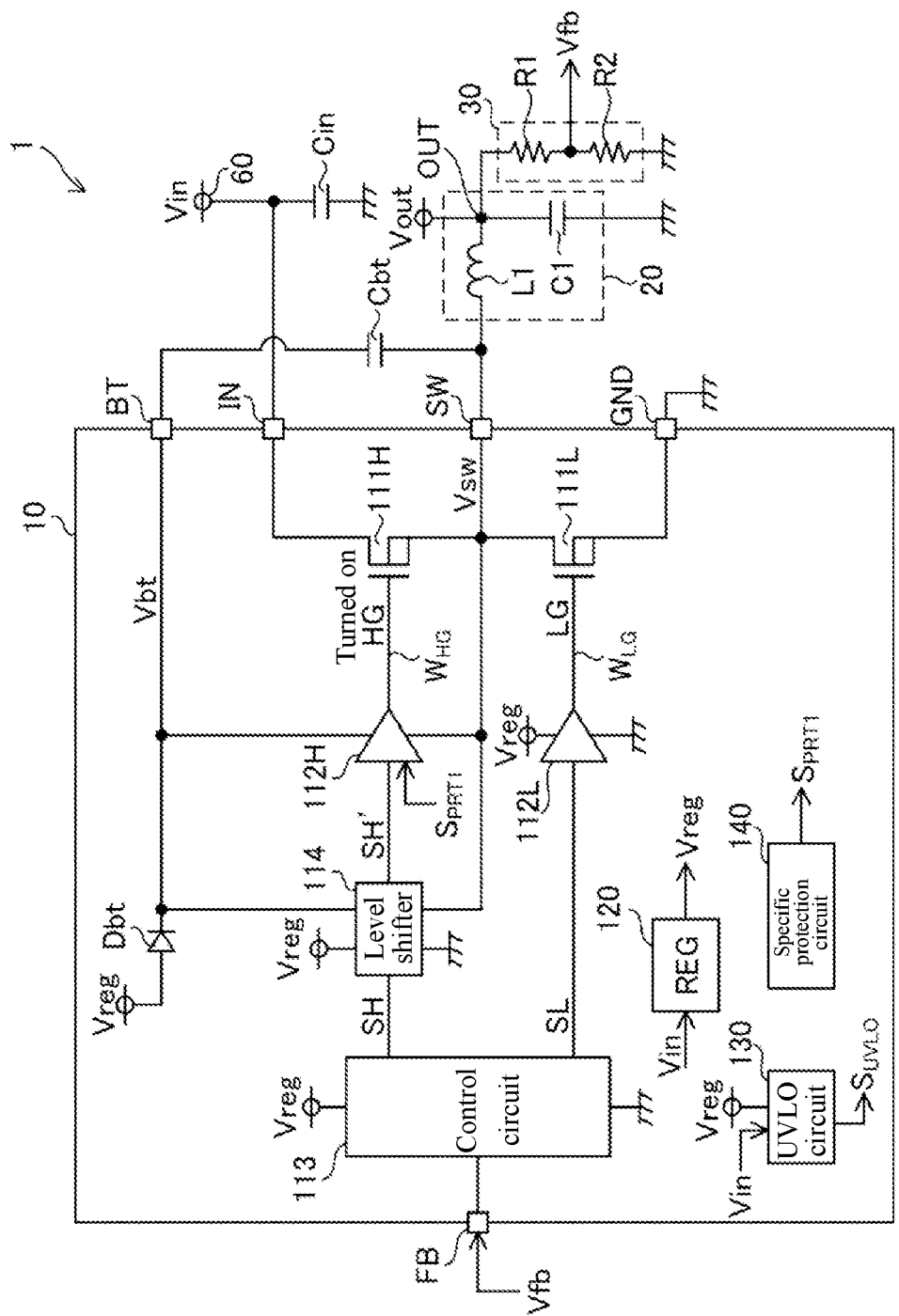
FIG. 5 is a diagram illustrating a situation of a signal output from a specific protection circuit according to an embodiment of the disclosure.

As shown in FIG. 5, the specific protection operation $H_{ON\_FL}$ or $H_{ON\_PLS}$ for turning on the high-side transistor 111H may be implemented by outputting a predetermined protection control signal $S_{PRT1}$ to the high-side driver 112H by the specific protection circuit 140. Upon receiving the protection control signal $S_{PRT1}$, the high-side driver 112H controls the gate voltage HG by way of implementing the fully turning on or the turning on of the pulse of the transistor 111H based on the protection control signal $S_{PRT1}$ that is prioritized over the control signals SH and SH' (in other words, regardless of the control signals SH and SH'). The control above can be performed even if the power IC 10 is in a shutdown state.

Figure 6:
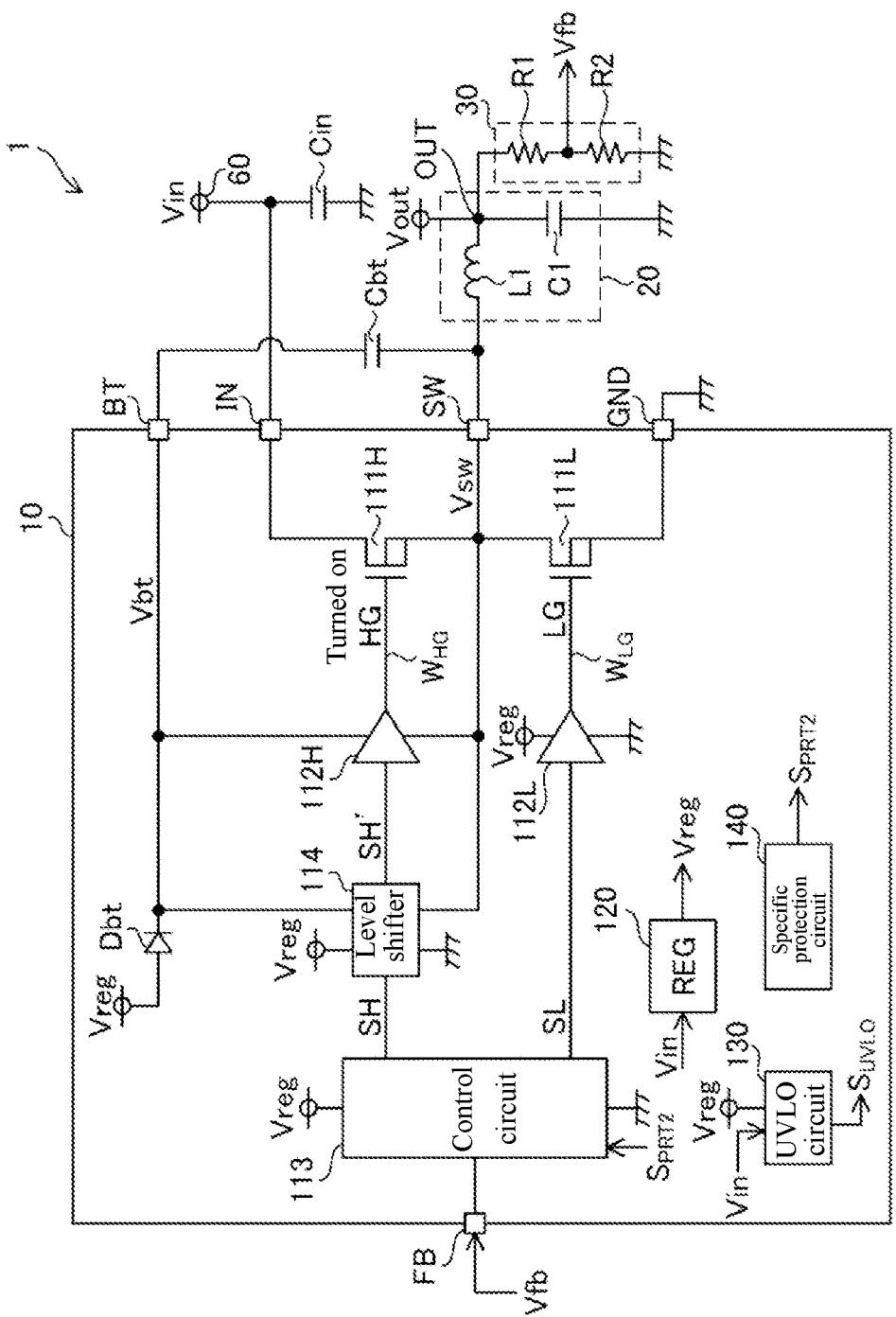
FIG. 6 is a diagram illustrating a situation of a signal output from a specific protection circuit according to an embodiment of the disclosure.

Alternatively, as shown in FIG. 6, the specific protection operation $H_{ON\_FL}$ or $H_{ON\_PLS}$ for turning on the high-side transistor 111H may be implemented by outputting a predetermined protection control signal $S_{PRT2}$ to the control circuit 113 by the specific protection circuit 140. Upon receiving the protection control signal $S_{PRT2}$, the control circuit 113 also outputs the high-side control signal SH by way of implementing the fully turning on or the turning on of the pulse of the transistor 111H, regardless of the feedback voltage Vfb and even if the power IC 10 is in a shutdown state. At this point, even if the high-side transistor 112H is in an off state, the gate voltage HG is controlled also according to the high-side control signal SH (specifically, the signal SH'), accordingly fully turning on or turning on the pulse of the high-side transistor 111H.

Figure 7:
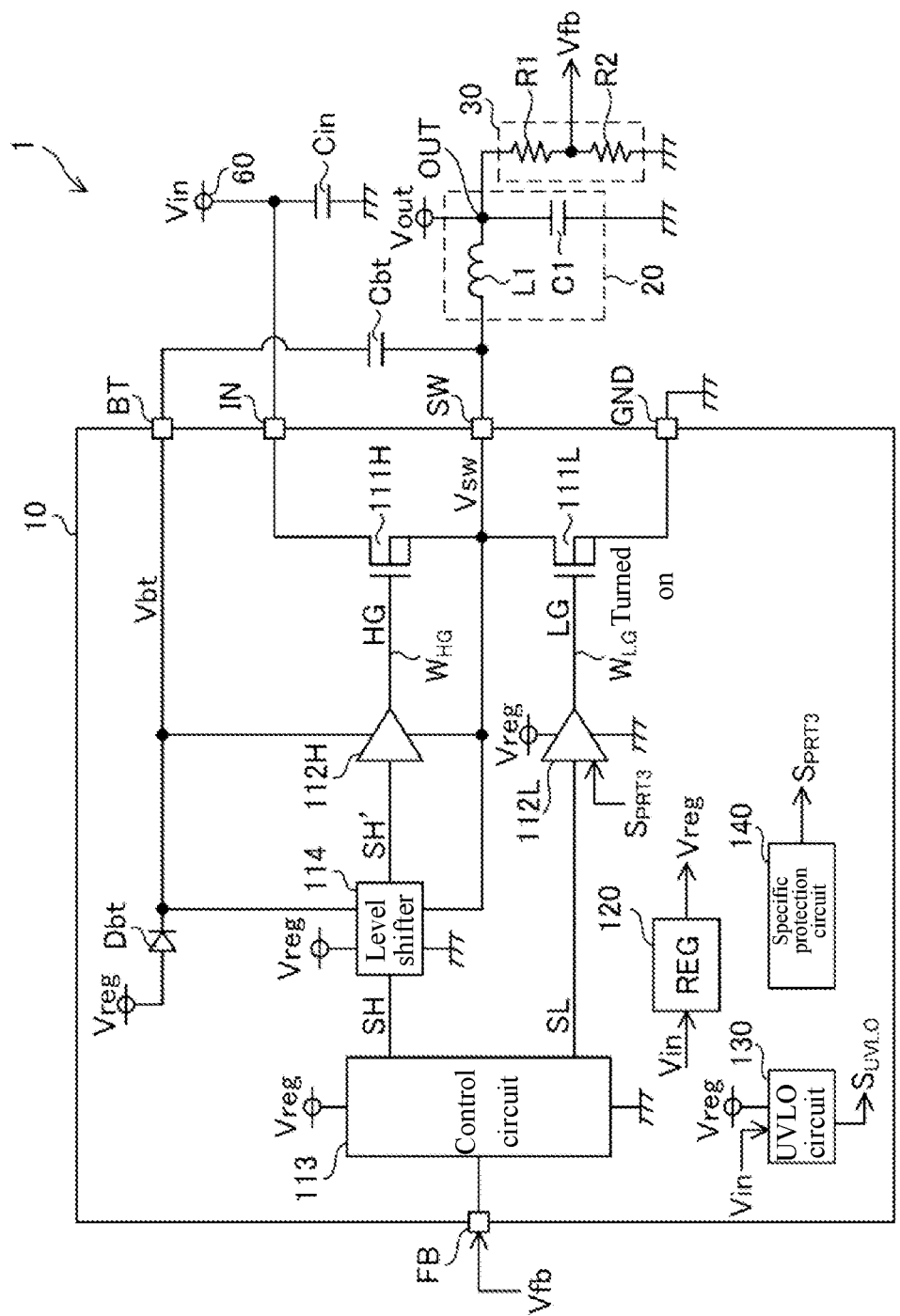
FIG. 7 is a diagram illustrating a situation of a signal output from a specific protection circuit according to an embodiment of the disclosure.

As shown in FIG. 7, the specific protection operation $L_{ON\_FL}$ or $L_{ON\_PLS}$ for turning on the low-side transistor 111L may be implemented by outputting a predetermined protection control signal $S_{PRT3}$ to the low-side driver 112L by the specific protection circuit 140. Upon receiving the protection control signal $S_{PRT3}$, the low-side driver 112L controls the gate voltage LG by way of implementing the fully turning on or the turning on of the pulse of the transistor 111L based on the protection control signal $S_{PRT3}$ that is prioritized over the control signal SL (in other words, regardless of the control signal SL). The control above can be performed even if the power IC 10 is in a shutdown state.

Figure 8:
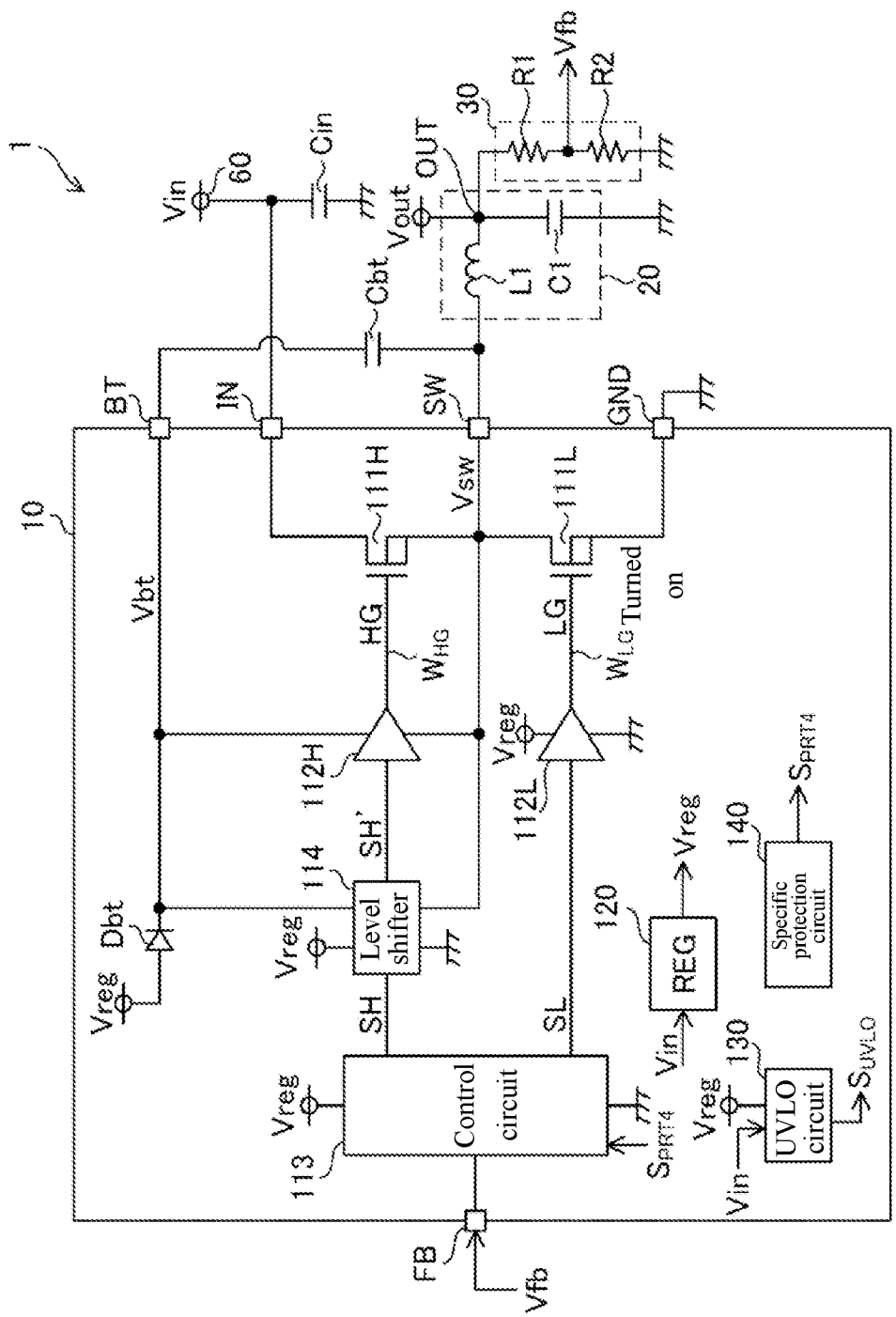
FIG. 8 is a diagram illustrating a situation of a signal output from a specific protection circuit according to an embodiment of the disclosure.

Alternatively, as shown in FIG. 8, the specific protection operation $L_{ON\_FL}$ or $L_{ON\_PLS}$ for turning on the low-side transistor 111L may be implemented by outputting a predetermined protection control signal $S_{PRT4}$ to the control circuit 113 by the specific protection circuit 140. Upon receiving the protection control signal $S_{PRT4}$, the control circuit 113 outputs the low-side control signal SL also by way of implementing the fully turning on or the turning on of the pulse of the transistor 111L, regardless of the feedback voltage Vfb and even if the power IC 10 is in a shutdown state. At this point, even if the low-side transistor 112L is in an off state, the gate voltage LG is controlled according to the low-side control signal SL, accordingly fully turning on or turning on the pulse of the low-side transistor 111L.

Moreover, the specific protection circuit 140 may be a circuit that operates based on the internal power voltage Vreg, and may also be a circuit that operates based on the output voltage Vout when an external terminal (not shown) receiving the output voltage Vout is provided in the power IC 10.

In a plurality of implementation examples below, the configuration and operation examples of the specific protection circuit 140, and application techniques and variation techniques related to the power supply device 1 are described. Unless otherwise specified and without any contradiction, the items in this embodiment are applicable to the various implementation examples below. In the various implementation examples, the description of the embodiments may also be overruling in the presence of any items contradictory from the items described above. Provided there are not contradictions, the items described in any one of the implementation examples below are also applicable to other implementation examples (that is to say, any two or more of the implementation examples can be combined).

Implementation Example EX_1A

Figure 9:
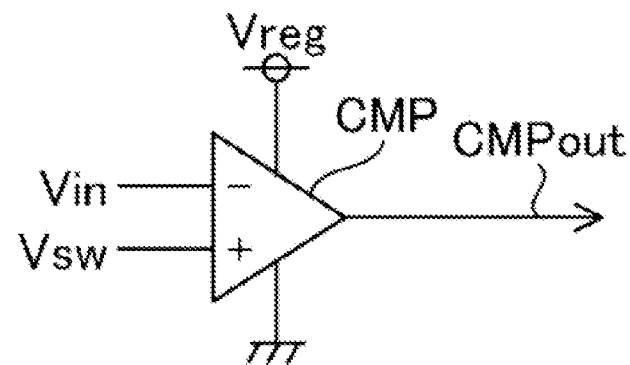
FIG. 9 is a diagram of a comparator provided in a specific protection circuit in implementation example EX-1A according to an embodiment of the disclosure.

Implementation example EX_1A is described below. In implementation example EX_1A, the configuration and operation beneficial to the first case are described. The specific protection circuit 140 in implementation example EX_1A includes a comparator CMP shown in FIG. 9. The comparator CMP compares the input voltage Vin at the input terminal IN with the switch voltage Vsw of the switch terminal SW, and outputs a signal CMPout corresponding to the comparison result. The comparison signal CMPout is a binary signal adopting a high level or a low level. A positive-side power voltage of the comparator CMP is the internal power voltage Vreg, and a negative-side power voltage of the comparator CMP is the ground. Thus, the high level of the signal CMPout is substantially the same as the level of the internal power voltage Vreg, and the low level of the signal CMPout is substantially the same as the level of the ground.

The input voltage Vin is input to the inverting input terminal of the comparator CMP, and the switch voltage Vsw is input to the non-inverting input terminal of the comparator CMP. Thus, the signal CMPout is at a high level when the switch voltage Vsw is above the input voltage Vin, and otherwise the signal CMPout is at a low level. The switch voltage Vsw is usually not higher than the input voltage. However, in case of damage such as short-circuitry of the input capacitor Cin occurs after the feedback control has been performed, the switch voltage Vsw is temporarily above the input voltage Vin. The situation above corresponds to the first case.

When the input voltage Vin drops towards 0 V in response to the damage such as short-circuitry of the input capacitor Cin occurred, the signal $S_{UVLO}$ switches from a high level to a low level, and the internal power voltage Vreg also continues to drop (referring to FIG. 4). However, after the signal $S_{UVLO}$ has switched to a low level, the internal power voltage Vreg is still kept at a positive voltage value for a certain period (for example, tens of microseconds), so that the comparator CMP can operate correctly; moreover, other circuits (including 113, 114, 112H and 112L) using the internal power voltage Vreg or the boot voltage Vbt can also operate correctly.

The specific protection operation is performed within a period in which the comparator CMP and the other circuits can operate correctly and within a period in which the comparator CMP outputs the signal CMPout at a high level.

Specifically, for example, the signal CMPout at a high level may be used to function as the protection control signal $S_{PRT1}$ (referring to FIG. 5). In this case, within a high level period of the signal CMPout, the high-side driver 112H is used to perform the specific protection operation $H_{ON\_FL}$ or $H_{ON\_PLS}$ for fully turning on or turning on the pulse of the high-side transistor 111H. When the specific protection operation $H_{ON\_FL}$ or $H_{ON\_PLS}$ is performed within a high level period of the signal CMPout, a circuit (not shown) that generates a predetermined rectangular wave signal in the high level period of the signal CMPout may also be provided in the specific protection circuit 140. In addition, by using the rectangular wave signal as the protection control signal $S_{PRT1}$ provided to the high-side driver 112H, turning on of the pulse of the high-side transistor 111H can also be implemented.

Alternatively, for example, the signal CMPout at a high level may be used to function as the protection control signal $S_{PRT2}$ (referring to FIG. 6). In this case, the high-side control signal SH for fully turning on or turning on the pulse of the high-side transistor 111H is generated in the control circuit 113 that receives the protection control signal $S_{PRT2}$. Thus, within a high level period of the signal CMPout, the control circuit 113, the level shifter 114 and the high-side driver 112H are used to perform the specific protection operation $H_{ON\_FL}$ or $H_{ON\_PLS}$ for fully turning on or turning on the pulse of the high-side transistor 111H.

Alternatively, for example, the signal CMPout at a high level may be used to function as the protection control signal $S_{PRT3}$ (referring to FIG. 7). In this case, within a high level period of the signal CMPout, the low-side driver 112L is used to perform the specific protection operation $L_{ON\_FL}$ or $L_{ON\_PLS}$ for fully turning on or turning on the pulse of the low-side transistor 111L. When the specific protection operation $L_{ON\_PLS}$ is performed within a high level period of the signal CMPout, a circuit (not shown) that generates a predetermined rectangular wave signal in the high level period of the signal CMPout may also be provided in the specific protection circuit 140. In addition, by using the rectangular wave signal as the protection control signal $S_{PRT3}$ provided to the low-side driver 112L, turning on of the pulse of the low-side transistor 111H can also be implemented.

Alternatively, for example, the signal CMPout at a high level may be used to function as the protection control signal $S_{PRT4}$ (referring to FIG. 8). In this case, the low-side control signal SL for fully turning on or turning on the pulse of the low-side transistor 111L is generated in the control circuit 113 that receives the protection control signal $S_{PRT4}$. Accordingly, within a high level period of the signal CMPout, the control circuit 113 and the low-side driver 112L are used to perform the specific protection operation $L_{ON\_FL}$ or $L_{ON\_PLS}$ for fully turning on or turning on the pulse of the low-side transistor 111L.

Implementation Example EX_1B

Figure 10:
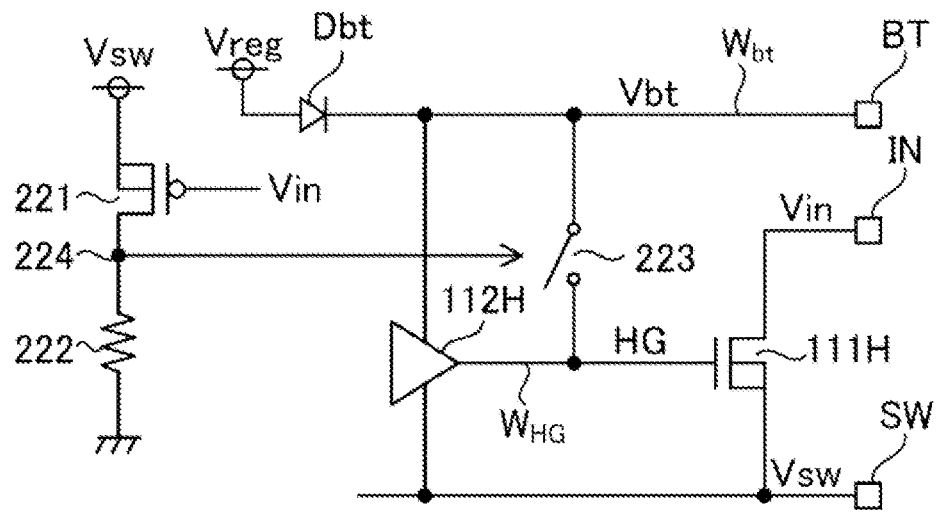
FIG. 10 is a diagram of implementation example EX_1B according to an embodiment of the disclosure, depicting a main part of the implementation example.

Implementation example EX_1B is described below. In implementation example EX_1B, the configuration and operation beneficial to the first case are also described. FIG. 10 shows a main part of the configuration related to the implementation example EX_1B. The specific protection circuit 140 in implementation example EX_1B includes a protection transistor 221, a resistor 222 and a switch 223. The protection transistor 221 is a P-channel MOSFET.

In the protection transistor 221, the switch voltage Vsw is applied to the source, and the input voltage Vin is applied to the gate. The drain of the protection transistor 221 is connected to one end portion of the resistor 222 via a node 224, and the other end portion of the resistor 222 is grounded. The node 224 is connected to a control terminal of the switch 223. One terminal of the switch 223 is connected to the boot terminal BT and a wire $W_{bt}$ connected to the cathode of the diode Dbt. Thus, the boot voltage Vbt is applied to one terminal of the switch 223. The other terminal of the switch 223 is connected to a wire $W_{HG}$.

The switch 223 is turned on or off according to the voltage applied to its control terminal, that is, the voltage at the node 224. A voltage as a voltage drop of the resistor 222 is generated at the node 224. When the switch voltage Vsw is caused to be above the input voltage Vin due to damage such as short-circuitry of the input capacitor Cin, and when a value of the difference between the switch voltage Vsw and the input voltage is greater than a value of a gate threshold voltage of the of protection transistor 221, the protection transistor 221 is turned on. When the protection transistor 221 is turned on, a current flows from the switch terminal SW through the protection transistor 221 and the resistor 222 to the ground, and the voltage at the node 224 rises because of the current. The switch 223 is in an on state whenever the voltage at the node 224 is a predetermined positive voltage, and otherwise is in an off state.

When the switch 223 is turned on based on the voltage drop of the resistor 222, the boot voltage Vbt is applied to the wire $W_{HG}$ via the switch 223, so that the high-side transistor 111H is turned on. The protection transistor 221 is turned off when the value of the difference between the voltages Vsw and Vin is smaller than the value of the gate threshold voltage of the protection transistor 221 as a result of turning on of the high-side transistor 111H. Even if the protection transistor 221 is turned off such that the high-side transistor 111H is also turned off, the protection transistor 221 is nonetheless turned on when the difference between the voltages Vsw and Vin later increases, and the high-side transistor 111H is again turned on.

Moreover, in implementation example EX_1B, when the signal $S_{UVLO}$ becomes at a low level due to damage such as short-circuitry of the input capacitor Cin and when the power IC 10 is in a shutdown state, an input impedance to the output terminal of the high-side transistor 112H observed from the wire $W_{HG}$ becomes sufficiently high (that is, the positive charge supplied from the boot terminal BT to the wire $W_{HG}$ is not attracted by the driver 112H). However, to prevent a fully floating state of the wire $W_{HG}$, a resistor (not shown) having a sufficiently high resistance value may also be placed between the wire $W_{HG}$ and the ground.

As such, in implementation example EX_1B, the specific protection operation for implementing turning on of the high-side transistor 111H within an on period of the protection transistor 221 is performed; in the specific protection operation, the high-side transistor 111H is turned on based on the boot voltage Vbt (that is, positive charge supplied to the wire $W_{HG}$ via the wire $W_{bt}$). Accumulated charge of the capacitor C1 can be safely discharged by turning on the high-side transistor 111H.

Figure 11:
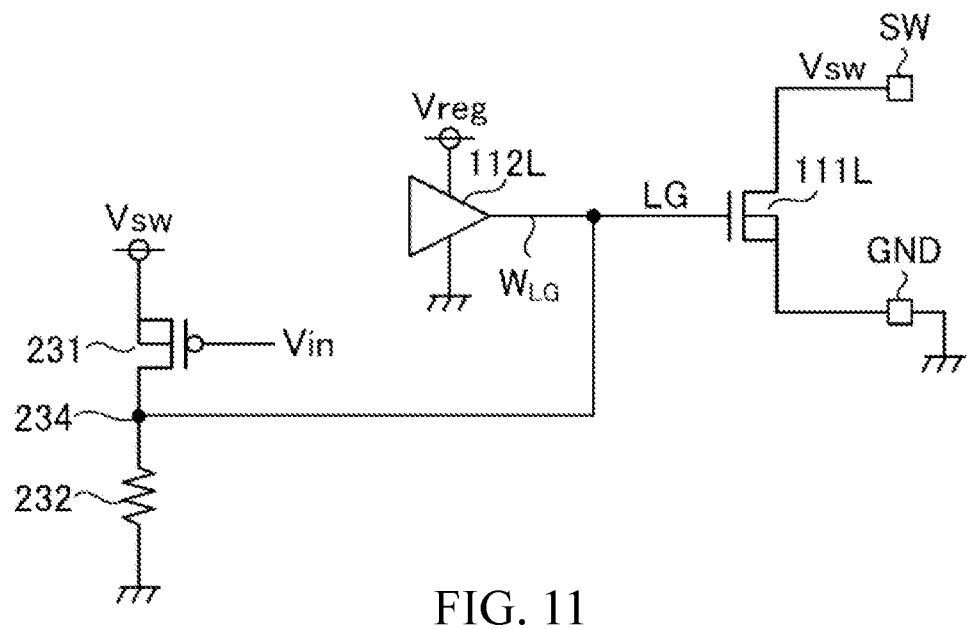
FIG. 11 is a diagram of implementation example EX_1C according to an embodiment of the disclosure, depicting a main part of the implementation example.

The protection transistor 221 may also be a PNP bipolar transistor. In this case, the source, drain and gate of the protection transistor 221 are alternatively referred to as the emitter, collector and base. Moreover, the resistor 222 is used to function as an element for detecting a current flowing in the protection transistor 221. However, a MOSFET or a capacitor may also be used in substitution for the resistor 222 as an element for implementing the function Implementation Example EX_1C Implementation example EX_1C is described below. In implementation example EX_1C, the configuration and operation beneficial to the first case are also described. FIG. 11 shows a main part of the configuration related to the implementation example EX_1C. The specific protection circuit 140 in implementation example EX_1C includes a protection transistor 231 and a resistor 232. The protection transistor 231 is a P-channel MOSFET.

In the protection transistor 231, the switch voltage Vsw is applied to the source, and the input voltage Vin is applied to the gate. The drain of the protection transistor 231 is connected to one end portion of the resistor 232 via a node 234, and the other end portion of the resistor 232 is grounded. The node 234 is connected to a wire $W_{LG}$.

A voltage as a voltage drop of the resistor 232 is generated at the node 234. When the switch voltage Vsw is caused to be above the input voltage Vin due to damage such as short-circuitry of the input capacitor Cin, and when a value of the difference between the switch voltage Vsw and the input voltage Vin is greater than a value of a gate threshold voltage of the of protection transistor 231, the protection transistor 231 is turned on. When the protection transistor 231 is turned on, a current flows from the switch terminal SW through the protection transistor 231 and the resistor 232 to the ground, and the voltage at the node 234 rises because of the current.

Moreover, when the protection transistor 231 is turned on, positive charge is injected from the switch terminal SW through the protection transistor 231 to the wire $W_{LG}$, and the gate voltage LG accordingly becomes above the gate threshold voltage of the transistor 111L, and the low-side transistor 111L is turned on at this point. The protection transistor 221 is turned off when the value of the difference between the voltages Vsw and Vin is smaller than the value of the gate threshold voltage of the protection transistor 221 as a result of turning on of the low-side transistor 111L, and then the low-side transistor 111L is turned off. However, the protection transistor 231 is turned on when the difference between the voltages Vsw and Vin again increases, and the low-side transistor 111L is again turned on. Accumulated charge of the capacitor C1 can be safely discharged by repeating the turning on and turning off as above.

Moreover, in implementation example EX_1C, when the signal $S_{UVLO}$ becomes at a low level due to damage such as short-circuitry of the input capacitor Cin and when the power IC 10 is in a shutdown state, an input impedance to the output terminal of the low-side transistor 112L observed from the wire $W_{LG}$ becomes sufficiently high (that is, the positive charge supplied from the protection transistor 231 to the wire $W_{LG}$ is not attracted by the driver 112L).

As such, in implementation example EX_1C, the specific protection operation for implementing turning on of the low-side transistor 111L within an on period of the protection transistor 231 is performed; in the specific protection operation, the low-side transistor 111L is turned on based on the switch voltage Vsw (that is, positive charge supplied from the switch SW to the wire $W_{LG}$). Accumulated charge of the capacitor C1 can be safely discharged by turning on the low-side transistor 111L.

The protection transistor 231 may also be a PNP bipolar transistor. In this case, the source, drain and gate of the protection transistor 231 are alternatively referred to as the emitter, collector and base. Moreover, the resistor 232 is used to function as an element for detecting a current flowing in the protection transistor 231. However, a MOSFET or a capacitor may also be used in substitution for the resistor 232 as an element for implementing the function.

Implementation Example EX_2

Implementation example EX_2 is described below. In implementation example EX_2, the configuration and operation beneficial to the first case are described.

The protection circuit 140 of implementation example EX_2 detects a current flowing from the ground terminal GND to the switch voltage SW (to be referred to as a backflow current below) when the power IC 10 is shut down by the protection shutdown operation performed by the specific protection circuit 140, and performs the specific protection operation $L_{ON\_FL}$ or $L_{ON\_PLS}$ for fully turning on or turning on the pulse of the low-side transistor 111L based on the detection result of the backflow current.

Figure 12:
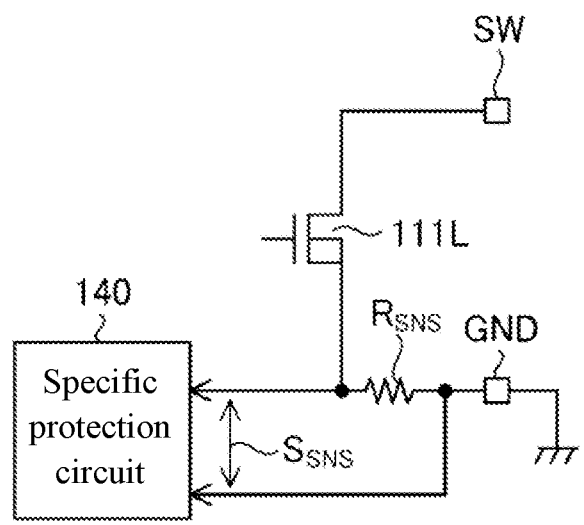
FIG. 12 is a diagram of implementation example EX_2 according to an embodiment of the disclosure, depicting a main part of the implementation example.
Figure 13:
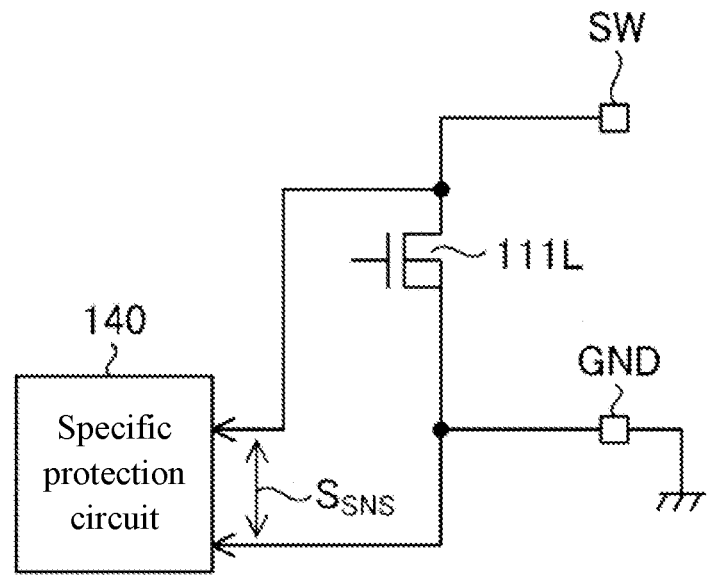
FIG. 13 is a diagram of implementation example EX_2 according to an embodiment of the disclosure, depicting a main part of the implementation example.

Specifically, for example, as shown in FIG. 12, a resistor $R_{SNS}$ is placed between the source of the low-side transistor 111L and the ground terminal GND, to provide a sensing signal $S_{SNS}$ indicating a voltage between two end portions of the sensing resistor $R_{SNS}$ to the specific protection circuit 140. In FIG. 12, it is considered that the sensing resistor $R_{SNS}$ should be disposed in the power IC 10; however, the sensing resistor $R_{SNS}$ may also be disposed outside the power IC 10. Alternatively, as shown in FIG. 13, instead of providing the sensing resistor $R_{SNS}$, a voltage between the source and the drain of the low-side transistor 111L is used as the sensing signal $S_{SNS}$ and provided to the specific protection circuit 140.

The specific protection circuit 140 detects for the presence of a backflow current based on the sensing signal $S_{SNS}$ The backflow current when the low-side transistor 111L is turned off passes through the parasitic diode of the low-side transistor 111L and flows. Upon detecting the presence of the backflow current in a shutdown state, the specific protection circuit 140 outputs the protection control signal $S_{PRT3}$ to the low-side driver 112L (referring to FIG. 7) or outputs the protection control signal $S_{PRT4}$ to the control circuit 113 (referring to FIG. 8). As described above, even if the low-side driver 112L is in a turned off state, the gate voltage LG is controlled by way of implementing fully turning on or turning on the pulse of the transistor 111L once the protection control signal $S_{PRT3}$ is received. Even if the control circuit 113 is in a turned off state, the low-side control signal SL is output by way of implementing fully turning on or turning on the pulse of the transistor 111L once the protection control signal $S_{PRT4}$ is received.

A circuit different from the circuit shown in FIG. 12 may also be used to detect for the presence of a backflow current. Alternatively, a circuit that outputs a predetermined signal when the switch voltage Vsw is below a predetermined negative voltage (for example, −0.5 V) in a turned off state may also be provided in the specific protection circuit 140. In this case, it would be appropriate that when the predetermined signal is output, upon detecting the presence of the backflow current, the specific protection circuit 140 outputs the protection control signal $S_{PRT3}$ to the low-side driver 112L (referring to FIG. 7) or outputs the protection control signal $S_{PRT4}$ to the control circuit 113 (referring to FIG. 8).

Implementation Example EX_3

Figure 14:
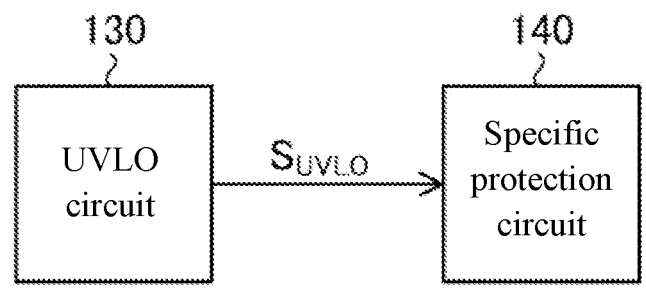
FIG. 14 is a diagram of an implementation example EX_3 according to an embodiment of the disclosure, depicting a main part of the implementation example.

Implementation example EX_3 is described below. In implementation example EX_3, the configuration and operation beneficial to the first case are described. The specific protection circuit 140 of implementation example EX_3 performs the specific protection operation based on the output signal $S_{UVLO}$ of the UVLO circuit 130 (referring to FIG. 14). That is, when the signal $S_{UVLO}$ switches from a high level to a low level, the specific protection circuit 140 receives an output of the signal $S_{UVLO}$ (UVLO signal) at a low level and then performs the specific protection operation. In other words, the specific protection operation is triggered as the signal $S_{UVLO}$ switches from a high level to a low level.

In implementation example EX_3, the specific protection operation performed based on the signal $S_{UVLO}$ (UVLO signal) at a low level may be any of the specific protection operations $H_{ON\_FL}$, $H_{ON\_PLS}$, $L_{ON\_FL}$ and $L_{ON\_PLS}$. That is, in the specific protection operation of implementation example EX_3, accumulated charge in the capacitor C1 may be discharged by fully turning on or turning on the pulse of the transistor 111H or 111L. The specific protection circuit 140 only needs to output the control signal $S_{PRT1}$, $S_{PRT2}$, $S_{PRT3}$ or $S_{PRT4}$ (referring to FIG. 5 to FIG. 8) in order to perform the specific protection operation $H_{ON\_FL}$, $H_{ON\_PLS}$, $L_{ON\_FL}$ or $L_{ON\_PLS}$. Moreover, the specific protection circuit 140 of implementation example EX_3 may be a circuit that operates based on the internal power voltage Vreg, and may also be a circuit that operates based on the output voltage Vout when an external terminal (not shown) receiving the output voltage Vout is provided in the power IC 10.

Implementation Example EX_4

Implementation example EX_4 is described below. In implementation example EX_4, several variation examples applying any of the items are described.

For any signal or voltage, the relationship between a high level and a low level may be opposite to the relationship described, provided that the form of the subject is not compromised.

For the FETs in the various embodiments, the types of channels are only exemplary, and the configuration including an FET circuit may be modified by changing the N-channel FET to the P-channel FET, or changing the P-channel FET to the N-channel FET.

Given that no inappropriateness is incurred, an arbitrary transistor may also be any type of transistor. For example, given that no inappropriateness is incurred, an arbitrary transistor implemented by a MOSFET may be replaced by a junction FET, an insulated gate bipolar transistor (IGBT) or a bipolar transistor. An arbitrary transistor includes a first electrode, a second electrode and a third electrode. In an FET, one of the first and second electrodes is the drain and the other is the source, and the control electrode is the gate. In an IGBT, one between the first and second electrodes is the collector and the other is the emitter, and the control electrode is the gate. For a bipolar transistor that is not an IGBT, one of the first and second electrodes is the collector and the other is the emitter, and the control electrode is the base.

Notes are given for the circuit for switching power supply of the disclosure. According to an embodiment of the disclosure, a circuit (10) for switching power supply and forming a switching power supply device (1) that generates an output voltage (Vout) based on an input voltage (Vin) includes: an input terminal (IN), which should receive the input voltage; a switch terminal (SW); a ground terminal (GND); a high-side transistor (111H), disposed between the input terminal and the switch terminal; a low-side transistor (111L), disposed between the switch terminal and the ground terminal; a gate driver (112H, 112L), configured for driving each gate of the high-side transistor and the low-side transistor; a control circuit (113), using the gate driver to perform a feedback control to turn on or off the high-side transistor and the low-side transistor based on a feedback voltage (Vfb) corresponding to the output voltage; and a protection circuit (140), capable of performing a protection operation for turning on the high-side transistor or the low-side transistor regardless of the feedback control based on a switch voltage at the switch terminal and the input voltage (for example, referring to FIG. 9 to FIG. 11, implementation examples EX_1A to 1C), based on a backflow current from the ground terminal to the switch terminal (for example, referring to FIG. 12 and FIG. 13, implementation example EX_2), or based on the input voltage and a predetermined determination voltage (for example, referring to FIG. 3 and FIG. 14, implementation example EX_3).

Various modifications may be made to the embodiments of the disclosure within the scope of the technical concept of the claims. The embodiments above are only examples of possible implementations of the disclosure, and the meanings of the terms of the disclosure or the constituent components are not limited to the meanings of the terms used in the embodiments above. The specific numerical values used in the description are only examples, and these numerical values may be modified to various other numerical values.

The invention claimed is:

1. A circuit operable to switch a power supply and form a power supply device that is operable to generate an output voltage based on an input voltage, the circuit comprising:
   an input terminal operable to receive the input voltage;
   a switch terminal;
   a ground terminal;
   a high-side transistor, disposed between the input terminal and the switch terminal;
   a low-side transistor, disposed between the switch terminal and the ground terminal;

a gate driver operable to drive each gate of the high-side transistor and the low-side transistor;

a control circuit operable to use the gate driver to perform a feedback control to turn on or off the high-side transistor and the low-side transistor based on a feedback voltage corresponding to the output voltage; and a protection circuit operable to perform a protection operation for turning on the high-side transistor or the low-side transistor regardless of the feedback control based on a switch voltage at the switch terminal and the input voltage, based on a backflow current from the ground terminal to the switch terminal, or based on the input voltage and a predetermined determination voltage, wherein the protection circuit is operable to perform the protection operation when the switch voltage is greater than the input voltage.

2. The circuit of claim 1, wherein the protection circuit includes a comparator operable to compare the switch voltage with the input voltage, and when a signal indicating the switch voltage is greater than the input voltage is output from the comparator, the protection operation is performed.

3. The circuit of claim 1, further comprising a boot terminal connected to the switch terminal via a capacitor, wherein the high-side transistor and the low-side transistor are operable to be alternately turned on and off by the feedback control to generate a boot voltage greater than the input voltage at the boot terminal, the protection circuit includes a protection transistor operable to be turned on according to a difference between the switch voltage and the input voltage when the switch voltage is greater than the input voltage, and the protection operation is operable to be performed during an on period of the protection transistor, and the high-side transistor is operable to be turned on based on the boot voltage in the protection operation.

4. The circuit of claim 1, wherein the protection circuit includes a protective transistor that is operable to be turned on according to a difference between the switch voltage and the input voltage when the switch voltage is greater than the input voltage, and the protection operation is operable to be performed during an on period of the protective transistor, and the low-side transistor is operable to be turned on based on the switch voltage in the protection operation.

5. The circuit of claim 1, wherein the protection circuit is operable to detect the backflow current in a shutdown state in which the feedback control is stopped, and performs the protection operation of turning on the low-side transistor based on a detection result of the backflow current.

6. The circuit of claim 1, further comprising an under-voltage-lockout (UVLO) detection circuit operable to output a predetermined UVLO signal when the input voltage drops below the predetermined determination voltage, and the protection circuit is operable to receive an output of the predetermined UVLO signal and performs the protection operation.

7. A switching power supply device, comprising:
the circuit of claim 1;
a rectifying smoothing circuit operable to generate the output voltage by means of rectifying and smoothing the switch voltage generated at the switch terminal by alternately turning on and off the high-side transistor and the low-side transistor by the feedback control; and a feedback circuit operable to generate the feedback voltage according to the output voltage.

8. A switching power supply device, comprising:
the circuit of claim 1;
a rectifying smoothing circuit operable to generate the output voltage by means of rectifying and smoothing the switch voltage generated at the switch terminal by alternately turning on and off the high-side transistor and the low-side transistor by the feedback control; and
a feedback circuit operable to generate the feedback voltage according to the output voltage.

9. A switching power supply device, comprising:
the circuit of claim 2;
a rectifying smoothing circuit operable to generate the output voltage by means of rectifying and smoothing the switch voltage generated at the switch terminal by alternately turning on and off the high-side transistor and the low-side transistor by the feedback control; and
a feedback circuit operable to generate the feedback voltage according to the output voltage.

10. A switching power supply device, comprising:
the circuit of claim 3;
a rectifying smoothing circuit operable to generate the output voltage by means of rectifying and smoothing the switch voltage generated at the switch terminal by alternately turning on and off the high-side transistor and the low-side transistor by the feedback control; and
a feedback circuit operable to generate the feedback voltage according to the output voltage.

11. A switching power supply device, comprising:
the circuit of claim 4;
a rectifying smoothing circuit operable to generate the output voltage by means of rectifying and smoothing the switch voltage generated at the switch terminal by alternately turning on and off the high-side transistor and the low-side transistor by the feedback control; and
a feedback circuit operable to generate the feedback voltage according to the output voltage.

12. A switching power supply device, comprising:
the circuit of claim 5;
a rectifying smoothing circuit operable to generate the output voltage by means of rectifying and smoothing the switch voltage generated at the switch terminal by alternately turning on and off the high-side transistor and the low-side transistor by the feedback control; and
a feedback circuit operable to generate the feedback voltage according to the output voltage.

13. A switching power supply device, comprising:
the circuit of claim 6;
a rectifying smoothing circuit operable to generate the output voltage by means of rectifying and smoothing the switch voltage generated at the switch terminal by alternately turning on and off the high-side transistor and the low-side transistor by the feedback control; and
a feedback circuit operable to generate the feedback voltage according to the output voltage.

14. A circuit operable to switch a power supply and forma power supply switching device that is operable to generate an output voltage based on an input voltage, the circuit comprising:
an input terminal operable to receive the input voltage;
a switch terminal;
a ground terminal
a high-side transistor disposed between the input terminal and the switch terminal;
a low-side transistor disposed between the switch terminal and the ground terminal;

a gate driver operable to drive each gate of the high-side transistor and the low-side transistor;

a control circuit operable to use the gate driver to perform a feedback control to turn on or off the high-side transistor and the low-side transistor based on a feedback voltage corresponding to the output voltage; and a protection circuit operable to perform a protection operation for turning on the high-side transistor or the low-side transistor regardless of the feedback control
based on a switch voltage at the switch terminal and the input voltage,
based on a backflow current from the ground terminal to the switch terminal, or
based on the input voltage and a predetermined determination voltage,
wherein the protection circuit is operable to detect the backflow current in a shutdown state in which the feedback control is stopped, and perform the protection operation of turning on the low-side transistor based on a detection result of the backflow current.

15. A circuit operable to switch a power supply and form a power supply switching device that is operable to generate an output voltage based on an input voltage, the circuit comprising:

an input terminal operable to receive the input voltage;
a switch terminal;
a ground terminal;
a high-side transistor disposed between the input terminal and the switch terminal;
a low-side transistor disposed between the switch terminal and the ground terminal;
a gate driver operable to drive each gate of the high-side transistor and the low-side transistor;
a control circuit operable to use the gate driver to perform a feedback control to turn on or off the high-side transistor and the low-side transistor based on a feedback voltage corresponding to the output voltage;
an undervoltage-lockout (UVLO) detection circuit operable to output a predetermined UVLO signal when the input voltage drops below the predetermined determination voltage; and
a protection circuit operable to perform a protection operation for turning on the high-side transistor or the low-side transistor regardless of the feedback control
based on a switch voltage at the switch terminal and the input voltage,
based on a backflow current from the ground terminal to the switch terminal, or
based on the input voltage and a predetermined determination voltage,
wherein the protection circuit is operable to receive an output of the predetermined UVLO signal and performs the protection operation.

* * * * *